(12) United States Patent
Trzemzalski

(10) Patent No.: US 10,998,760 B2
(45) Date of Patent: May 4, 2021

(54) SYSTEM AND METHOD FOR CONTROLLING UNINTERRUPTIBLE POWER SUPPLY OF ELECTRICAL POWER SYSTEMS

(71) Applicant: General Electric Company, Schenectady, NY (US)

(72) Inventor: Joseph Andrew Trzemzalski, Simpsonville, SC (US)

(73) Assignee: General Electric Company, Schenectady, NY (US)

( * ) Notice: Subject to any disclaimer, the term of this patent is extended or adjusted under 35 U.S.C. 154(b) by 210 days.

(21) Appl. No.: 16/144,409

(22) Filed: Sep. 27, 2018

(65) Prior Publication Data
US 2020/0106295 A1  Apr. 2, 2020

(51) Int. Cl.
*H02J 9/06* (2006.01)
*F03D 9/11* (2016.01)
(Continued)

(52) U.S. Cl.
CPC .............. *H02J 9/062* (2013.01); *F03D 9/11* (2016.05); *F03D 9/255* (2017.02); *G01R 15/04* (2013.01);
(Continued)

(58) Field of Classification Search
CPC ........... F03D 9/11; F03D 9/255; G01R 15/04; G01R 31/3835; G01R 31/392;
(Continued)

(56) References Cited

U.S. PATENT DOCUMENTS 5,886,503 A * 3/1999 McAndrews ......... H02J 7/0022
320/121
6,316,917 B1  11/2001 Ohta
(Continued)

FOREIGN PATENT DOCUMENTS

| EP | 3226380 A1 | 10/2017 |
| WO | WO2011152777 A1 | 12/2011 |
| WO | WO2015015388 A1 | 2/2015 |

OTHER PUBLICATIONS

European Search Report, dated Nov. 15, 2019.

*Primary Examiner* — Daniel J Cavallari
*Assistant Examiner* — Brian K Baxter
(74) *Attorney, Agent, or Firm* — Dority & Manning, P.A.

(57) ABSTRACT

Systems and methods of controlling uninterruptible power supplies of electrical power systems are described. According to one aspect, an electrical power system can include a generator having a stator and a rotor, a power converter coupled to a rotor bus of the rotor, and a control system comprising one or more control devices, the one or more control devices configured to operate the power converter to provide an AC signal for a rotor bus. The system can also include an uninterruptible power supply (UPS). The UPS can include a power storage element configured to receive and store electrical power, and configured to power the control system during a power failure, and, a health check circuit configured to verify a health status of the power storage element, and including a health check disable component configured to disable the health check circuit during the power failure.

20 Claims, 5 Drawing Sheets

(51) Int. Cl.
  *F03D 9/25* (2016.01)
  *G01R 31/3835* (2019.01)
  *G01R 15/04* (2006.01)
  *H02J 3/32* (2006.01)
  *H02J 3/38* (2006.01)

(52) U.S. Cl.
  CPC ............ *G01R 31/3835* (2019.01); *H02J 3/32* (2013.01); *H02J 3/386* (2013.01); *H02J 9/063* (2020.01)

(58) Field of Classification Search
  CPC .... H02J 11/00; H02J 3/32; H02J 3/381; H02J 3/386; H02J 9/06; H02J 9/062; H02J 2300/10; H02J 2300/28; H02J 9/063
  USPC .......................................................... 307/64
  See application file for complete search history.

(56) References Cited

U.S. PATENT DOCUMENTS

| | | | |
|---|---|---|---|
| 6,809,433 B2 | 10/2004 | Nozu | |
| 7,602,075 B2 | 10/2009 | Erdman et al. | |
| 7,952,232 B2 | 5/2011 | Burra et al. | |
| 8,415,818 B2 * | 4/2013 | Engelhardt | F03D 9/255 290/44 |
| 9,077,201 B2 | 7/2015 | Matsuoka et al. | |
| 9,465,082 B2 | 10/2016 | Butzmann | |
| 2004/0145188 A1 | 7/2004 | Janssen et al. | |
| 2006/0018073 A1 | 1/2006 | Thrap | |
| 2006/0214428 A1 * | 9/2006 | Altemark | F03D 9/255 290/44 |
| 2008/0296975 A1 * | 12/2008 | Shakespeare | H02J 9/065 307/66 |
| 2009/0066089 A1 * | 3/2009 | Arinaga | F03D 7/0276 290/55 |
| 2009/0278354 A1 * | 11/2009 | Ichinose | F03D 9/255 290/44 |
| 2009/0302608 A1 * | 12/2009 | Andresen | F03D 9/10 290/44 |
| 2010/0213712 A1 * | 8/2010 | Arinaga | H02J 3/48 290/44 |
| 2011/0001353 A1 * | 1/2011 | Emerson | B60L 50/40 307/9.1 |
| 2011/0089694 A1 * | 4/2011 | Arinaga | F03D 7/043 290/44 |
| 2011/0204630 A1 * | 8/2011 | Arinaga | H02P 9/04 290/44 |
| 2012/0217824 A1 * | 8/2012 | Gupta | F03D 9/10 307/145 |
| 2013/0181450 A1 * | 7/2013 | Narayana | F03D 7/0224 290/44 |
| 2013/0184884 A1 * | 7/2013 | More | H02J 3/14 700/291 |
| 2014/0015321 A1 | 1/2014 | Nordin | |
| 2015/0180273 A1 * | 6/2015 | Wagoner | F03D 9/11 290/50 |
| 2017/0271913 A1 | 9/2017 | Nasiri et al. | |
| 2018/0191236 A1 * | 7/2018 | Wagoner | H02M 1/126 |
| 2019/0280508 A1 * | 9/2019 | Tabib | H02J 7/0034 |

\* cited by examiner

SYSTEM AND METHOD FOR CONTROLLING UNINTERRUPTIBLE POWER SUPPLY OF ELECTRICAL POWER SYSTEMS

FIELD

The present disclosure relates generally to electrical power systems, and more particular to a system and method for controlling an uninterruptible power supply of an electrical power system.

BACKGROUND

Wind power is considered one of the cleanest, most environmentally friendly energy sources presently available, and wind turbines have gained increased attention in this regard. A modern wind turbine typically includes a tower, generator, gearbox, nacelle, and one or more rotor blades. The rotor blades capture kinetic energy of wind using known airfoil principles. For example, rotor blades typically have the cross-sectional profile of an airfoil such that, during operation, air flows over the blade producing a pressure difference between the sides. Consequently, a lift force, which is directed from a pressure side towards a suction side, acts on the blade. The lift force generates torque on the main rotor shaft, which is geared to a generator for producing electricity.

During operation, wind impacts the rotor blades of the wind turbine and the blades transform wind energy into a mechanical rotational torque that rotatably drives a low-speed shaft. The low-speed shaft is configured to drive the gearbox that subsequently steps up the low rotational speed of the low-speed shaft to drive a high-speed shaft at an increased rotational speed. The high-speed shaft is generally rotatably coupled to a generator so as to rotatably drive a generator rotor. As such, a rotating magnetic field may be induced by the generator rotor and a voltage may be induced within a generator stator that is magnetically coupled to the generator rotor. In certain configurations, the associated electrical power can be transmitted to a turbine transformer that is typically connected to a power grid via a grid breaker. Thus, the turbine transformer steps up the voltage amplitude of the electrical power such that the transformed electrical power may be further transmitted to the power grid.

In many wind turbines, the generator rotor may be electrically coupled to a bi-directional power converter that includes a rotor side converter joined to a line side converter via a regulated DC link. More specifically, some wind turbines, such as wind-driven doubly-fed induction generator (DFIG) systems or full power conversion systems, may include a power converter with an AC-DC-AC topology. In such system, the generator stator is separately connected to the power grid via a main transformer.

The power converter usually includes several switching devices such as insulated gate bipolar transistors (IGBTs), integrated gate commutated thyristors (IGCTs or GCTs), diodes, or metal oxide semiconductor field effect transistors (MOSFETs) that are switched at certain frequencies to generate the desired converter output voltage and frequency. The converter output voltage is then provided to various loads such as motors, power grids, resistive loads, etc.

Some grid and/or wind conditions can cause a full or partial power failure which disrupts power to the switching devices, which then disables the power converter. Such power failures are undesirable and can cause maintenance issues. Typical solutions involve large, heavy, lead-acid battery-based back-up power supplies to provide power to the control system, thereby retaining operation of the power converter during power failures. However, these lead-acid battery systems involve increased cost and complexity in integration. Other controllable systems may be more desirable.

BRIEF DESCRIPTION

Aspects and advantages of the invention will be set forth in part in the following description, or may be obvious from the description, or may be learned through practice of the invention.

According to one aspect, an electrical power system connected to a power grid can include a generator comprising a stator and a rotor, the stator connected to the power grid via a stator power path, a power converter coupled to a rotor bus of the rotor, and a control system comprising one or more control devices, the one or more control devices configured to operate the power converter to provide an AC signal for the rotor bus. The system can also include an uninterruptible power supply (UPS). The UPS can include a power storage element configured to receive and store electrical power, and configured to power the control system during a power failure, and, a health check circuit configured to verify a health status of the power storage element, and including a health check disable component configured to disable the health check circuit during the power failure.

According to an additional aspect, a method of operating an uninterruptible power supply for a doubly fed induction generator system is described. The method can include converting an AC power at a line-side converter to a DC power for a DC link, storing power in the uninterruptible power supply, performing a health check on a rate of decay of a power storage element in the uninterruptible power supply with health check circuitry, sensing a first condition in the AC power, and, disabling the health check in response to sensing the first condition.

According to yet another aspect, a wind turbine system can include a generator having a stator and a rotor, the stator connected to the power grid via a stator power path. The system can also include a power converter having a line-side converter coupled to the power grid via a converter power path, and, a rotor-side converter coupled to a rotor bus of the rotor and the line-side converter via a DC link. The system can also include a control system having one or more control devices, the one or more control devices configured to operate the rotor-side converter to provide the AC signal for the rotor bus. The system can also include an uninterruptible power supply including a power storage element configured to receive and store electrical power, and configured to power the control system during a power failure, and, a health check circuit configured to verify a health status of the power storage element, and including a health check disable component configured to disable the health check circuit during the power failure.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION

Figure 1:
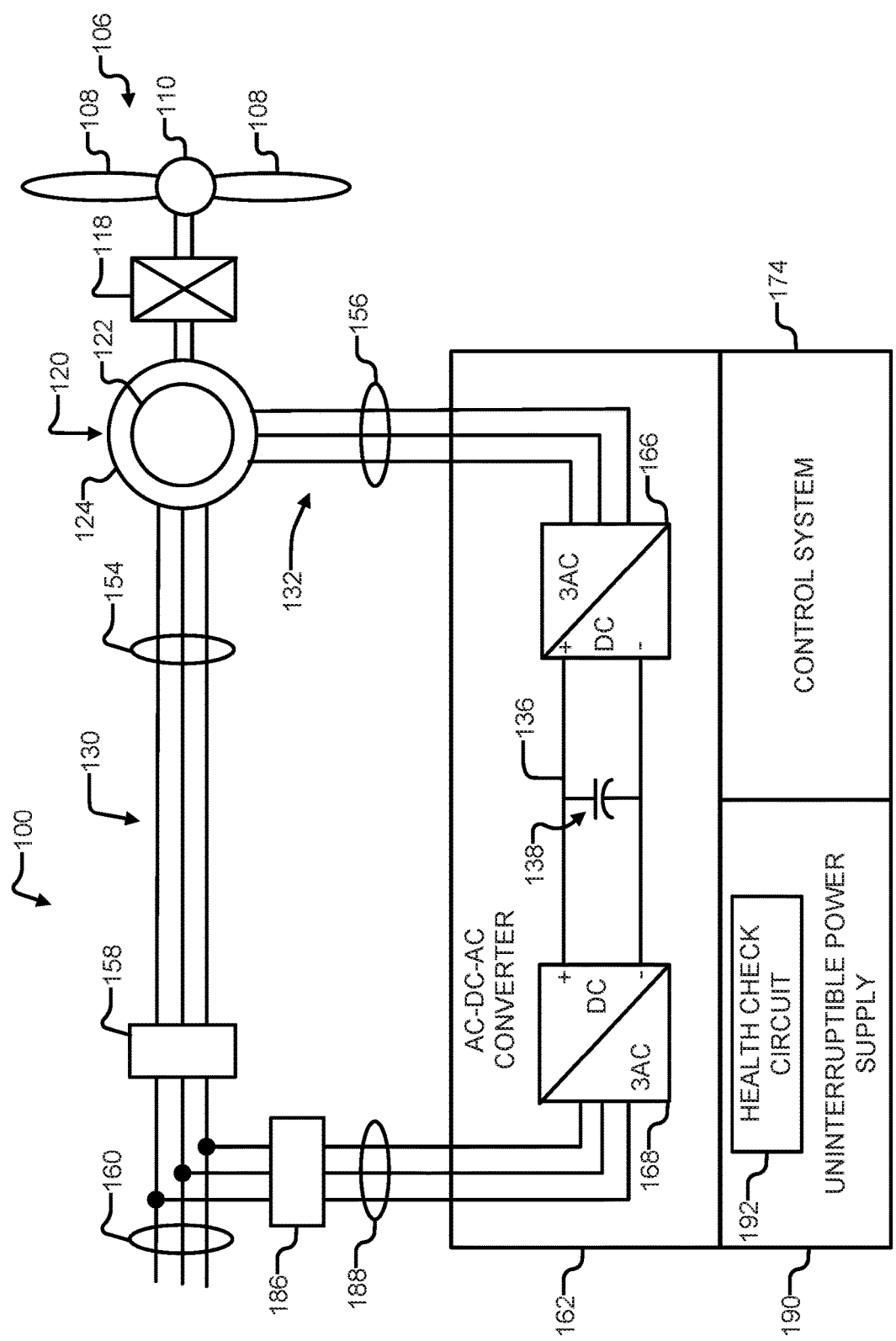
FIG. 1 illustrates one embodiment of an example electrical power system according to the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Example aspect of the present disclosure are directed to systems and methods for controlling uninterruptible power supplies of electrical power systems, such as DFIG power systems, using a health check circuit and a health check disable component. More specifically, example aspects of the present disclosure provide a system for controlling the uninterruptible power supply in response to various operating conditions, such as phase voltage, DC link voltage, DC link current, system current feedbacks, and/or system voltage feedbacks for the purpose of ensuring control system operation during a power failure with integrated health checks to ensure the health of the uninterruptible power supply. For example, the voltage decay of rechargeable power supply storage devices can be measured against tolerance bands to ensure healthy operation. In other instances, the health check can be disabled to ensure a control system is powered by the rechargeable power supply storage devices.

In particular embodiments, the method for controlling the uninterruptible power supply may include disabling a health check and disabling health check circuitry in response to a sensed condition in AC power associated with the electrical power system. Further, the system and method may be applied to any electrical power system, including but not limiting to wind conversion systems, solar conversions systems, energy storage systems, and combinations thereof.

Accordingly, the present disclosure has many technical effects and advantages. For example, the system and method of the present disclosure provides a higher system reliability (e.g. periodic health checks, etc.) as well as lower system cost (e.g. lower weight of components, lower cost of components, and/or lower maintenance costs).

Referring now to the drawings, FIG. 1 illustrates an example wind driven doubly-fed induction generator (DFIG) system 100 according to one embodiment of the present disclosure. Example aspects of the present disclosure are discussed with reference to the DFIG wind turbine 100 of FIG. 1 for purposes of illustration and discussion. Those of ordinary skill in the art, using the disclosures provided herein, should understand that example aspects of the present disclosure are also applicable in other power systems, such as a wind, solar, gas turbine, or other suitable power generation systems.

In the example system 100, a rotor 106 includes a plurality of rotor blades 108 coupled to a rotatable hub 110. The rotatable hub 110 is coupled to an optional gearbox 118, which is, in turn, coupled to a generator 120 having a rotor 122 and a stator 124. In accordance with aspects of the present disclosure, the generator 120 may be any suitable generator, including for example, a doubly fed induction generator (DFIG). The generator 120 is typically coupled to a stator bus 154 and a power converter 162 via a rotor bus 156. The stator bus 154 provides an output multiphase power (e.g. three-phase power) from a stator of the generator 120 and the rotor bus 156 provides an output multiphase power (e.g. three-phase power) of a rotor of the generator 120.

The power converter 162 includes a rotor-side converter 166 coupled to a line-side converter 168. The DFIG 120 is coupled to the rotor-side converter 166 via the rotor bus 156. The line-side converter 168 is coupled to a line-side bus 188. Further, as shown, the stator bus 154 may be directly connected to the line-side bus 188. In example configurations, the rotor-side converter 166 and the line-side converter 168 are configured for normal operating mode in a three-phase, PWM arrangement using insulated gate bipolar transistor (IGBT) switching devices. The rotor-side converter 166 and the line-side converter 168 can be coupled via a DC link 136 across which is the DC link capacitor 138. In alternative embodiments, the stator bus 154 and the power converter 162 may be connected to separate isolated windings of a transformer (not shown), i.e. at the junction of the generator breaker 158 and the converter breaker 186.

Figure 2:
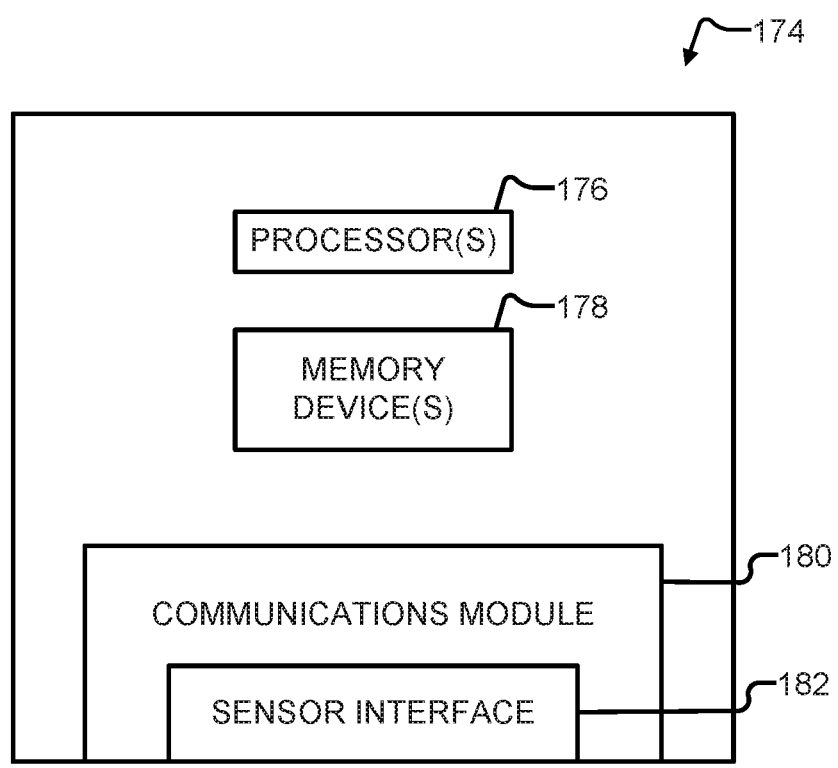
FIG. 2 illustrates a block diagram of one embodiment of a control system suitable for use with the electrical power system shown in FIG. 1.

The power converter 162 can be coupled to a control system 174 to control the operation of the rotor-side converter 166 and the line-side converter 168 and other aspects of the power system 100. For example, as shown particularly in FIG. 2, the control system 174 can include any number of control devices. In one implementation, for example, the control system 174 can include one or more processor(s) 176 and associated memory device(s) 178 configured to perform a variety of computer-implemented functions and/or instructions (e.g., performing the methods, steps, calculations and the like and storing relevant data as disclosed herein). The instructions when executed by the processor 176 can cause the processor 176 to perform operations, including providing control commands (e.g. pulse width modulation commands) to the switching devices of the power converter 162 and other aspects of the power system 100. Additionally, the control system 174 may also include a communications module 180 to facilitate communications between the control system 174 and the various components of the power system 100, e.g. any of the components of FIG. 1. Further, the communications module 180 may include a sensor interface 182 (e.g., one or more analog-to-digital converters) to permit signals transmitted from one or more sensors to be converted into signals that can be understood and processed by the processors 176. It should be appreciated that the sensors may be communicatively coupled to the communications module 180 using any suitable means. For example, the sensors can be coupled to the sensor interface 182 via a wired connection. However, in other embodiments, the sensors may be coupled to the sensor interface 182 via a wireless connection, such as by using any suitable wireless communications protocol known in the art. As such, the processor 176 may be configured to receive one or more signals from the sensors.

As used herein, the term "processor" refers not only to integrated circuits referred to in the art as being included in a computer, but also refers to a controller, a microcontroller, a microcomputer, a programmable logic controller (PLC), an application specific integrated circuit, and other programmable circuits. The processor 176 is also configured to compute advanced control algorithms and communicate to a variety of Ethernet or serial-based protocols (Modbus, OPC, CAN, etc.). Additionally, the memory device(s) 178 may generally comprise memory element(s) including, but not limited to, computer readable medium (e.g., random access memory (RAM)), computer readable non-volatile medium (e.g., a flash memory), a floppy disk, a compact disc-read only memory (CD-ROM), a magneto-optical disk (MOD), a digital versatile disc (DVD) and/or other suitable memory elements. Such memory device(s) 178 may generally be configured to store suitable computer-readable instructions that, when implemented by the processor(s) 176, configure the control system 174 to perform the various functions as described herein.

Turning back to FIG. 1, during operation, alternating current power generated at the DFIG 120 by rotation of the rotor 106 is provided via a dual path to an electrical grid 160. The dual paths are defined by a generator power path 130 and a converter power path 132. On the converter power path 132, sinusoidal multi-phase (e.g. three-phase) alternating current (AC) power is provided to the power converter 162 via the rotor bus 156.

The rotor-side power converter 166 converts the AC power provided from the rotor bus 156 into direct current (DC) power and provides the DC power to the DC link 136. Switching devices (e.g. IGBTs) used in bridge circuits of the rotor side power converter 166 can be modulated to convert the AC power provided from the rotor bus 156 into DC power suitable for the DC link 136.

The line-side converter 168 converts the DC power on the DC link 136 into AC output power suitable for the electrical grid 160. In particular, switching devices (e.g. IGBTs) used in bridge circuits of the line-side power converter 168 can be modulated to convert the DC power on the DC link 136 into AC power on the line-side bus 188. The AC power from the power converter 162 can be combined with the power from the stator of the DFIG 120 to provide multi-phase power (e.g. three-phase power) having a frequency maintained substantially at the frequency of the electrical grid 160 (e.g. 50 Hz/60 Hz).

Various circuit breakers and switches, such as a generator breaker 158 and converter breaker 186, can be included in the system 100 to connect or disconnect corresponding buses, for example, when current flow is excessive and can damage components of the wind turbine system 100 or for other operational considerations. Additional protection components can also be included in the wind turbine system 100.

The power converter 162 can receive control signals from, for instance, the control system 174. The control signals can be based, among other things, on sensed conditions or operating characteristics of the wind turbine system 100. Typically, the control signals provide for control of the operation of the power converter 162. For example, feedback in the form of sensed speed of the DFIG 120 can be used to control the conversion of the output power from the rotor bus 156 to maintain a proper and balanced multi-phase (e.g. three-phase) power supply. Other feedback from other sensors can also be used by the control system 174 to control the power converter 162, including, for example, stator and rotor bus voltages and current feedbacks. Using the various forms of feedback information, switching control signals (e.g. gate timing commands for IGBTs), stator synchronizing control signals, and circuit breaker signals can be generated.

As further illustrated, an uninterruptible power supply 190 may be configured to receive and store electrical power and power the control system 174 in the event of a power failure, partial power failure, or sensed power condition (e.g., an under-current or under-voltage condition). As used herein, a power failure refers to a condition where electrical power has been disrupted for more than about 1 second. Furthermore, a partial power failure refers to a condition where at least one phase of electrical power has been disrupted for more than about 1 second. Additionally, a sensed power condition can include a power failure or a partial power failure, as well as a sensed under-voltage or under-current condition. A sensed under-voltage condition can include any condition where electrical voltage has been reduced to under nominal voltage, or to under about 90% of nominal voltage (e.g., a 10% reduction). A sensed under-current condition can include any condition where electrical current has been reduced to under nominal current, or to under about 90% of nominal current (e.g., a 10% reduction). The uninterruptible power supply 190 may include a health check circuit 192 or health check circuitry configured to verify the healthy operation of power cells contained in the uninterruptible power supply 190. The uninterruptible power supply 190 may also include a power storage element configured to receive and store electrical power received from at least one phase of AC electrical power from the generator 120 (illustrated in FIG. 3). For example, the uninterruptible power supply may receive power from a power supply (e.g., 24 VDC power supply) in electrical communication with an auxiliary tap of a main transformer of the wind turbine 100.

Figure 3:
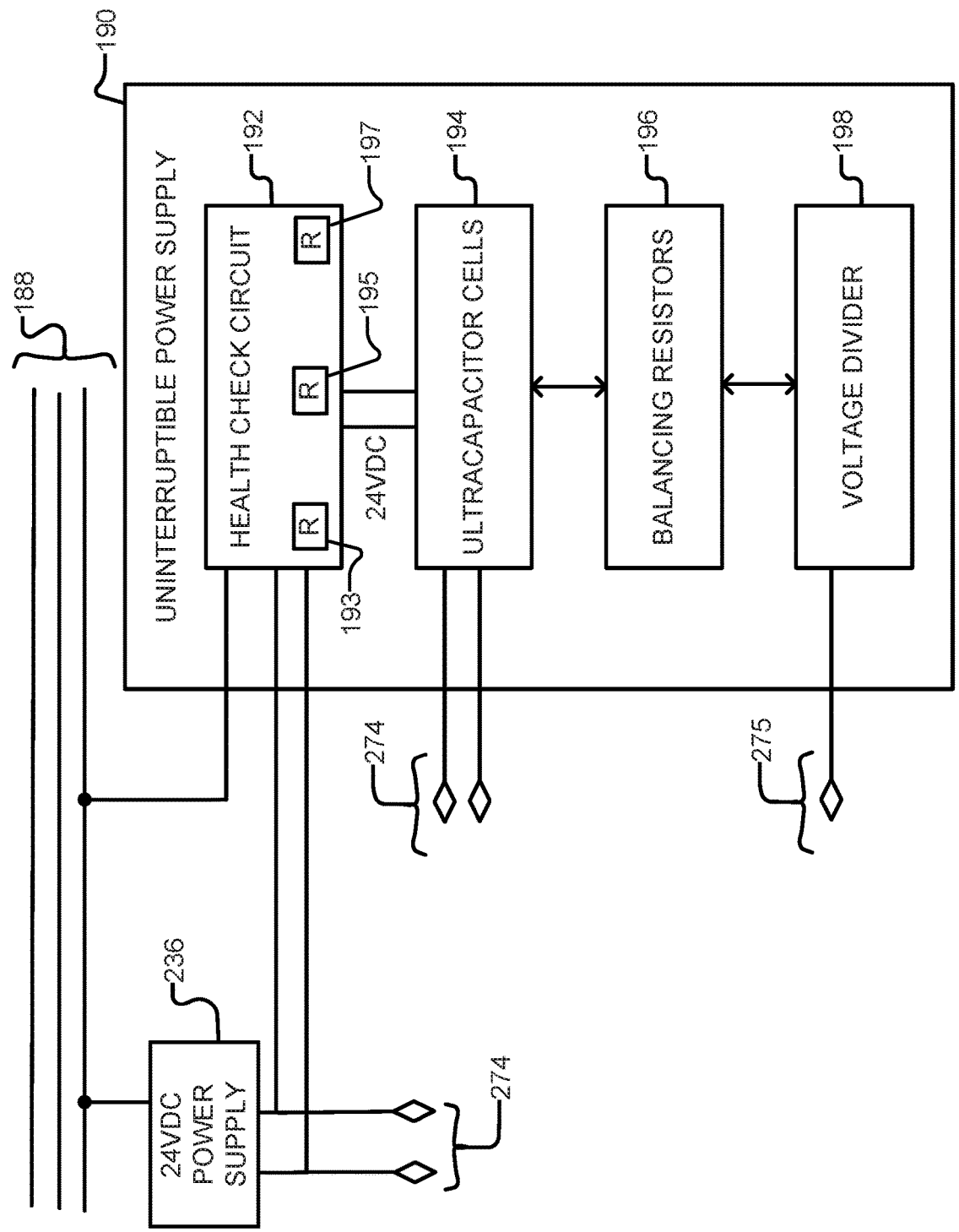
FIG. 3 illustrates a block diagram of one embodiment of an uninterruptible power supply for use with the electrical power system shown in FIG. 1.

Referring now to FIG. 3, a block diagram of the uninterruptible power supply 190 is provided. As shown, the uninterruptible power supply 190 is configured to sense at least one phase of power from a three-phase bus 188 of the system 100. It should be understood that voltage/current feedback from any phase is possible. Accordingly, for the purposes of clarity in discussion, a particular phase has been illustrated as being sensed. In other implementations, other phases or multiple phases may be sensed to determine a power condition such as failure, under-current, or under-voltage.

The uninterruptible power supply 190 can include the health check 192 described above. The health check circuit 192 can include a health check disable component 193 configured to disable a health check and disable the health check circuit 192. The health check disable component 193 can be a relay, such as an electro-mechanical relay or solid state relay configured to interrupt a health check by physically disconnecting the health check circuit 190 from power cells 194. In this manner, any health check being performed on power cells 194 is immediately ceased such that the power cells 194 can be used to power the control system 174 with leads 274 instead.

The health check circuit 194 further includes a power failure component 195. The power failure component 195 is configured to aid in performing a health check. For example, the power failure component may include a relay, such as an electro-mechanical relay or solid state relay. The health check circuit 192 also includes power resistor 197 of a known value. During a health check, the relay 195 physically connects the cells 194 to this power resistor 197, and the rate of voltage decay is monitored by the control system (through 275) to determine if the cells are healthy or not.

It should be understood that although described as being singular relays in one embodiment, the components 193 and 195 may include more or fewer components including multiple relays, switching devices, sensors, and other components performing similar functions. For example, two or more relays connected in series or parallel may provide basic health check disable functionality as well as providing additional signals for control operations. Similarly, two or more relays connected in series or parallel may provide basic uninterruptible power as well as provided additional signals for control operations. All such modifications are within the scope of this disclosure.

Generally, the power cells 194 may include any suitable power cells. For example, according to at least one embodiment, the power cells 194 are a number of series-connected or parallel-connected ultracapacitor cells. In one particular example, the ultracapacitor cells have a storage capacity of at least 300 Farads and are coupled in series.

As further shown, the uninterruptible power supply 190 further includes a plurality of balancing resistors 196. The plurality of balancing resistors 196 may be coupled to the bank of ultracapacitors 194. In this regard, the plurality of balancing resistors 196 are configured to distribute voltage imbalance across the bank of ultracapacitors 194. In one embodiment, each balancing resistor of the plurality of balancing resistors 196 is coupled across an individual ultracapacitor of the bank of ultracapacitors 194. For example, the individual resistors may be connected across terminals of each individual capacitor cell, to distribute voltage imbalance caused by varying levels of capacitance in a series chain. Other connections may be possible depending upon the particular configuration of the bank of ultracapacitors.

As further shown, the control system 174 is configured to monitor the uninterruptible power supply 190 via a voltage divider circuit 198 coupled to the power storage cells 194 and/or balancing resistors 196. For example, feedback signals of the + and − legs of the uninterruptible power supply 190 are monitored by the control system 174 through the voltage divider circuit 198 at 275. The control system 174 may have an analog input voltage range that is limited. Thus, the voltage divider circuit 198 can drop down the stored voltage to fall within the control system's range.

Figure 4:
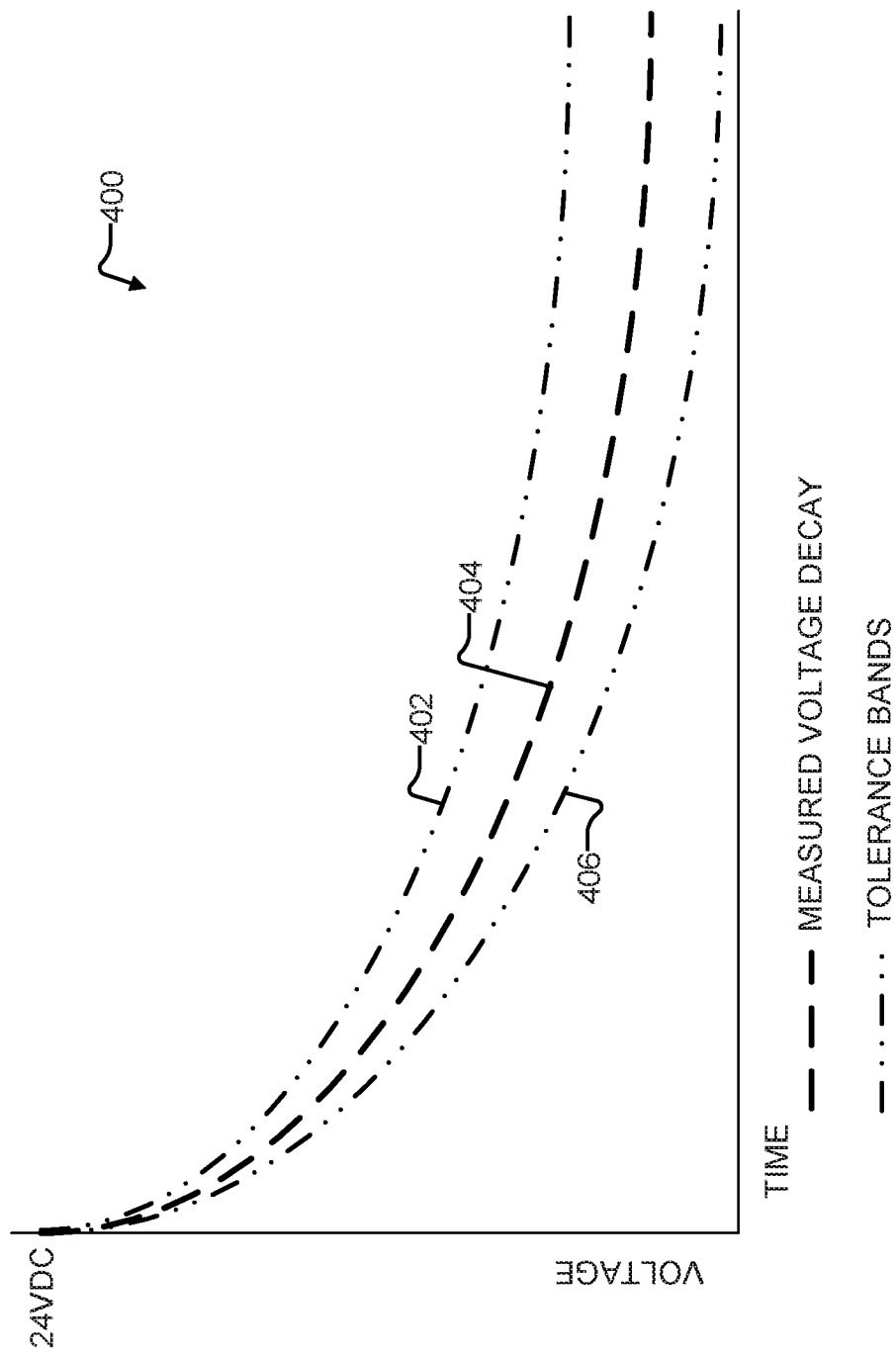
FIG. 4 illustrates a graph of measured voltage decay for a health check of the uninterruptible power supply shown in FIG. 3.

As described above, the health check circuit 192 is operative to evaluate the health of the uninterruptible power supply 190, and more particularly, the ultracapacitor cells 194. FIG. 4 illustrates a graph of measured voltage decay for a health check of the uninterruptible power supply 190. Periodically a health check of the ultracapacitor cells 194 is necessary to give confidence the uninterruptible power supply 190 can deliver backup power when necessary. This is achieved by switching the ultracapacitor cells 194 to connect to a load of known resistance (e.g., a power resistor). The voltage decay 404 is then measured against the expected decay curve for the load, within certain tolerance bands 402, 406, and the general health of the uninterruptible power supply 190 can then be ascertained. According to another embodiment, the voltage decay 404 may be measured against a single one of the tolerance bands, tolerance band 406, such that the general health of the uninterruptible power supply 190 can be ascertained.

Figure 5:
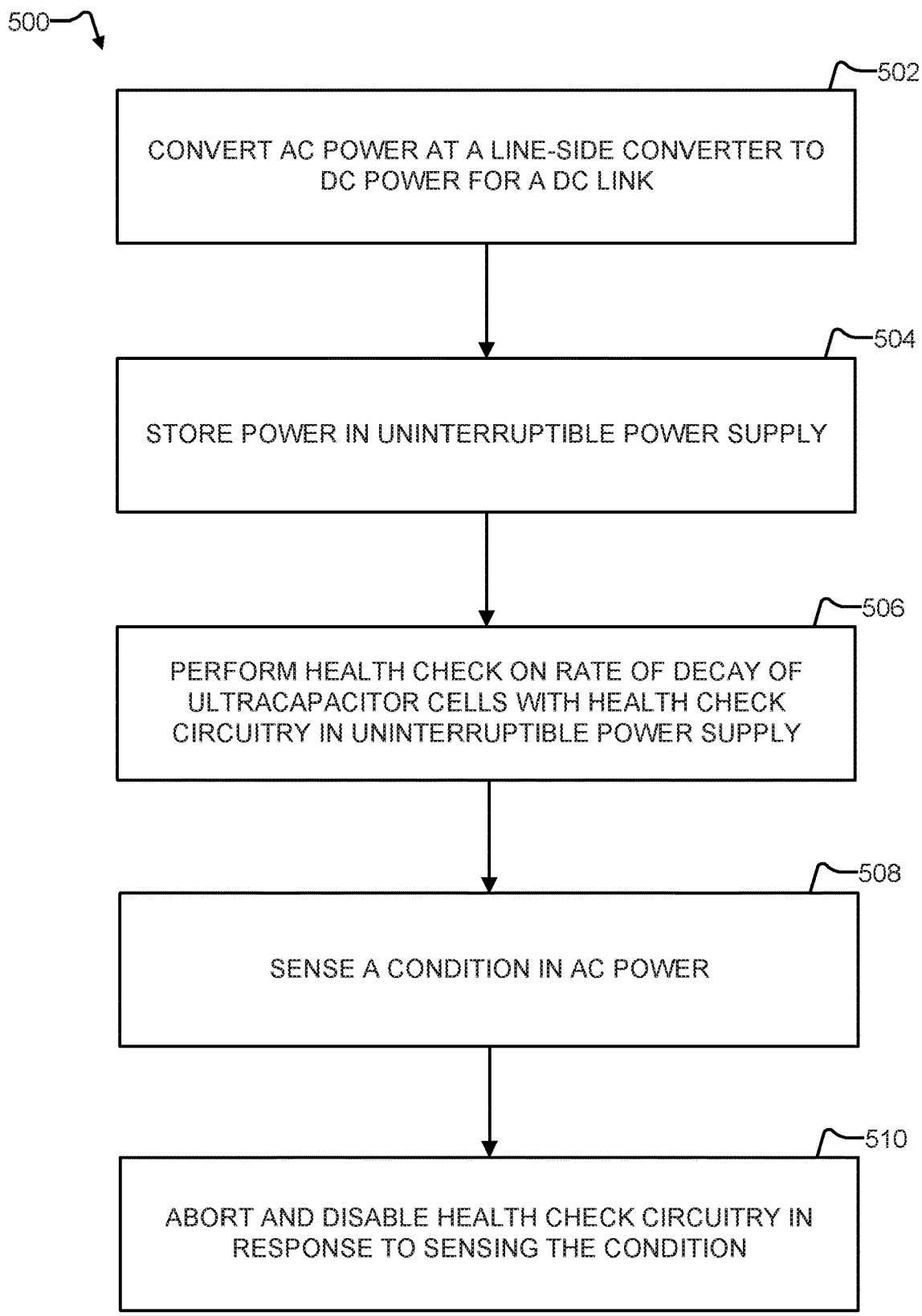
FIG. 5 illustrates a flow diagram of one embodiment of a method for controlling an uninterruptible power supply of an electrical power system according to the present disclosure.

FIG. 5 illustrates a flow diagram of one embodiment of a method 500 for controlling an uninterruptible power supply 190 of an electrical power system according to the present disclosure. The method 500 can include converting an AC power at a line-side converter 168 to a DC power for a DC link 136, at block 502.

The method 500 also includes storing power from the DC link 136 in the uninterruptible power supply 190, at block 504. For example, the ultracapacitor cells 194 may be charged with DC voltage from the power supply 236.

The method 500 also includes periodically performing a health check on a rate of decay of a power storage element (e.g., the ultracapacitor cells 194) in the uninterruptible power supply 194 with health check circuitry 192, at block 506.

The health check may be performed as described with reference to FIG. 4. For example, performing the health check on the rate of decay can include coupling the power storage element 194 to a resistance of known value (e.g., a power resistor) and measuring the rate of decay 404 over time. Then, the measured rate of decay can be compared against a set of tolerance decay bands 402, 406, or at least one of the tolerance decay bands 406.

The method 500 further includes sensing a first condition in the AC power, at block 508, and, disabling the health check in response to sensing the first condition, at block 510. The method 500 also includes disabling the health check circuitry 192 in response to sensing the first condition. Generally, the first condition may include a full or partial power failure at any phase of the 3-phase power buses illustrated in FIG. 1. According to at least one embodiment, the first condition is sensed at a first phase of a power bus.

As described above, an uninterruptible power supply may be integrated with an electrical power system. The uninterruptible power supply may include a health check circuit that periodically verifies the health of a power storage element, or elements, contained therein. Furthermore, the health check circuit and associated functions may be disabled and disabled using a health check disable component, such as a relay, to ensure power is always supplied to a control system of the electrical power system during a power failure.

Example embodiments of a wind turbine, a control system for a wind turbine, and methods of controlling a wind turbine are described above in detail. The methods, wind turbine, and control system are not limited to the specific embodiments described herein, but rather, components of the wind turbine and/or the control system and/or steps of the methods may be utilized independently and separately from other components and/or steps described herein. For example, the control system and methods may also be used in combination with other wind turbine power systems and methods, and are not limited to practice with only the power system as described herein. Rather, the exemplary embodiment can be implemented and utilized in connection with many other wind turbine or power system applications, such as solar power systems and energy storage systems.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. An electrical power system connected to a power grid, comprising:
   a generator comprising a stator and a rotor, the stator connected to the power grid via a stator power path;
   a power converter comprising a line-side converter and a rotor-side converter, the rotor-side converter coupled to the rotor via a rotor-side bus, the line-side converter coupled to a line-side bus;
   a power supply electrically coupled in parallel to the line-side bus; and
   a control system communicatively coupled to the electrical power system, the control system comprising one or more control devices, the one or more control devices configured to operate the electrical power system such that the rotor-side bus provides an AC signal for the power converter; and,
   an uninterruptible power supply comprising:
      a power storage element electrically coupled in parallel to the line-side bus, the power storage element also electrically coupled to the power supply, the power storage element configured to receive electrical power from the power supply, store the electrical power, and power the control system using the stored electrical power during a power failure; and,
      a health check circuit configured to verify a health status of the power storage element, the health check circuit comprising a health check disable component configured to disable the health check circuit during the power failure.

2. The electrical power system of claim 1, wherein the uninterruptible power supply further comprises a power failure sensor configured to sense a power failure condition on at least one phase of the rotor-side bus.

3. The electrical power system of claim 2, wherein the control system is configured to direct the uninterruptible power supply to power the control system during the power failure.

4. The electrical power system of claim 1, wherein the power storage element comprises at least one ultracapacitor.

5. The electrical power system of claim 4, wherein the at least one ultracapacitor comprises a storage capacity of at least 300 Farads.

6. The electrical power system of claim 1, wherein the power storage element comprises:
   a bank of ultracapacitors coupled in series; and,
   a plurality of balancing resistors coupled to the bank of ultracapacitors, wherein the plurality of balancing resistors are configured to distribute voltage imbalance across the bank of ultracapacitors.

7. The electrical power system of claim 6, wherein each balancing resistor of the plurality of balancing resistors is coupled across an individual ultracapacitor of the bank of ultracapacitors.

8. The electrical power system of claim 1, wherein the control system is further configured to monitor the uninterruptible power supply via a voltage divider circuit coupled to the power storage element.

9. A method of operating an uninterruptible power supply for a doubly fed induction generator system, the method comprising:
   electrically coupling a power converter having a line-side converter and a rotor-side converter to a generator of the doubly fed induction generator system, the rotor-side converter coupled to a rotor of the generator via a rotor-side bus, the line-side converter coupled to a line-side bus;
   electrically coupling a power supply in parallel to the line-side bus;
   electrically coupling a power storage element in parallel to the line-side bus and electrically coupling the power storage element to the power supply;
   converting an AC power at the line-side converter to a DC power for a DC link of the power converter;
   storing power in the uninterruptible power supply;
   performing a health check on a rate of decay of the power storage element in the uninterruptible power supply with health check circuitry;
   sensing a first condition in the AC power; and
   disabling the health check in response to sensing the first condition.

10. The method of claim 9, further comprising disabling the health check circuitry in response to sensing the first condition.

11. The method of claim 9, wherein performing the health check on the rate of decay comprises:
   coupling the power storage element to a resistance of known value; and
   measuring the rate of decay over time.

12. The method of claim 11, wherein performing the health check on the rate of decay further comprises comparing the measured rate of decay against a set of tolerance decay bands.

13. A wind turbine system connected to a power grid, comprising:
   a generator comprising a stator and a rotor, the stator connected to the power grid via a stator power path;
   a power converter comprising a line-side converter and a rotor-side converter, the line-side converter coupled to the power grid via a line-side bus, the rotor-side converter coupled to a rotor-side bus of the rotor and the line-side converter via a DC link;
   a power supply electrically coupled in parallel to the line-side bus; and
   a control system communicatively coupled to the electrical power system, the control system comprising one or more control devices, the one or more control devices configured to operate the electrical power system such that the rotor-side bus provides an AC signal for the power converter; and,
   an uninterruptible power supply comprising:
      a power storage element electrically coupled in parallel to the line-side bus, the power storage element also electrically coupled to the power supply, the power storage element configured to receive electrical power from the power supply, store the electrical power, and power the control system using the stored electrical power during a power failure; and,
      a health check circuit configured to verify a health status of the power storage element, and comprising a health check disable component configured to disable the health check circuit during the power failure.

14. The wind turbine system of claim 13, wherein the uninterruptible power supply further comprises a power failure sensor configured to sense a power failure condition on at least one phase of the rotor-side bus.

15. The wind turbine system of claim 14, wherein the power failure sensor is configured to direct the uninterruptible power supply to power the control system during the power failure.

16. The wind turbine system of claim 13, wherein the power storage element comprises at least one ultracapacitor.

17. The wind turbine system of claim 16, wherein the at least one ultracapacitor comprises a storage capacity of at least 300 Farads.

18. The wind turbine system of claim 13, wherein the power storage element comprises:
   a bank of ultracapacitors coupled in series; and,
   a plurality of balancing resistors coupled to the bank of ultracapacitors, wherein the plurality of balancing resistors are configured to distribute voltage imbalance across the bank of ultracapacitors.

19. The wind turbine system of claim 18, wherein each balancing resistor of the plurality of balancing resistors is coupled across an individual ultracapacitor of the bank of ultracapacitors.

20. The wind turbine system of claim 13, wherein the control system is further configured to monitor the uninterruptible power supply via a voltage divider circuit coupled to the power storage element.

\* \* \* \* \*